(12) United States Patent
Charagulla et al.

(10) Patent No.: US 7,031,222 B1
(45) Date of Patent: Apr. 18, 2006

(54) DQS POSTAMBLE FILTERING

(75) Inventors: Sanjay K. Charagulla, San Jose, CA (US); Chiakang Sung, Milpitas, CA (US); Joseph Huang, San Jose, CA (US); Bonnie I. Wang, Cupertino, CA (US); Yan Chong, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/046,007

(22) Filed: Jan. 28, 2005

(51) Int. Cl.
*G11C 8/00* (2006.01)

(52) U.S. Cl. ............... 365/233; 365/189.08; 326/38

(58) Field of Classification Search ............... 365/233, 365/189.08, 189.05; 326/38, 41
See application file for complete search history.

(56) References Cited

U.S. PATENT DOCUMENTS 5,898,702 A * 4/1999 Narayanan et al. ......... 714/726
6,472,904 B1 * 10/2002 Andrews et al. ............ 326/38
6,525,565 B1 * 2/2003 Young et al. ............... 326/46

* cited by examiner

*Primary Examiner*—Son T. Dinh
(74) *Attorney, Agent, or Firm*—Townsend and Townsend and Crew LLP; J. Matthew Zigmant

(57) ABSTRACT

Circuits, methods, and apparatus for filtering signals at a high-speed data interface. One exemplary embodiment is particularly configured to filter a clock signal at the end of a data burst received by a double-data rate memory interface. A clock input port is either connected or disconnected to an input cell. When a data burst is to be received, the clock input port is connected to the input cell. When the data burst concludes, the clock input port is disconnected from the input cell. In a specific embodiment, a signal is received indicating that a data burst is about to begin and the clock input port is connected to the input cell. The signal later changes state indicating that the last data bit is being received. When the last clock edge corresponding to the last data bit is received, the clock input port is disconnected from the input cell.

20 Claims, 7 Drawing Sheets

DQS POSTAMBLE FILTERING

BACKGROUND

The present invention relates to high-speed interface circuits in general and more particularly to circuits for filtering transient voltages received at a high-speed interface circuit.

Interface circuits are used to transfer data between two or more integrated circuits. The rate at which this transfer takes place has been increasing dramatically over the last several years. As data rates increase, new problems and difficulties arise. One problem that can come up is the result of transient voltages received at data input pins. Some interface circuitry, for example interface circuitry on field programmable gate arrays manufactured by Altera Corporation of San Jose, Calif., have become so advanced and so fast that they are able to detect these transient voltages and receive them as actual data. Accordingly, a received data stream may become corrupted due to the presence of these transients.

A major cause of these transients is the physical path that signals take when being transferred from one integrated circuit to another. This path typically begins at an integrated circuit output driver and pad. The output driver and pad have a capacitance associated with them. The signal then travels through a bondwire and lead frame of the transmitting integrated circuit, through a PC board trace, and into a receiving integrated circuit. These elements each have inductances and capacitances associated with them. At the receiving integrated circuit, the signal passes through a second lead frame and bond wire to an input gate. This adds even more inductance and capacitance to the path.

When an output driver provides an output such as a clock or data signal, charging currents are generated in these various stray capacitances. The charging currents flow through the inductances creating voltage transients such as ringing, overshoot, and the like.

These output signals typically switch between and first and second logic level. In this case, since the resulting voltage transients are associated with actual data edges, they can be anticipated and compensated for. As an example, set-up and hold times at most of the inputs of Altera's devices can be adjusted to avoid switching transients.

An output driver can also produce a voltage transition when it changes state from either a high or low voltage level to a tri-state or high impedance condition. For example, an output driver may have a resistive load terminated to a voltage midway between a supply voltage and ground. When the output driver changes state from a high logic level near the supply voltage to the tri-state condition, the output transitions from a high level to this midpoint. At this time, voltage transients may result. The same is true when a driver tri-states after providing a low level logic signal near ground, or changes from tri-state to an active high or low logic level.

The transients that occur at these times can be more problematic since they are not associated with an actual data or clock transition. For example, transients on a clock signal may appear as extra clock edges that clock data incorrectly, thus corrupting a received data stream.

It is thus desirable to filter these transient voltages such that they do not cause incorrect data clocking. It is further desirable that this filtering be done in a way that does not degrade circuit performance.

SUMMARY

Accordingly, embodiments of the present invention provide circuits, methods, and apparatus for filtering signals received by a high-speed data interface. One exemplary embodiment is particularly configured to filter a clock signal at the end of a data burst. In a this embodiment, the data burst is received by a double-data rate memory interface.

In another exemplary embodiment of the present invention, a clock input port is either connected or disconnected to an input cell. When a data burst is to be received, the clock input port is connected to the input cell. When the data burst concludes, the clock input port is disconnected from the input cell. In a specific embodiment, a signal is received indicating that a data burst is about to begin. The receipt of this signal causes the clock input port to be connected to the input cell. The signal later changes state indicating that the last data bit is being received. When the last clock edge corresponding to the last data bit is received, the clock input port is disconnected from the input cell. Various embodiments of the present invention may incorporate one or more of these or the other features described herein.

A better understanding of the nature and advantages of the present invention may be gained with reference to the following detailed description and the accompanying drawings.

DESCRIPTION OF EXEMPLARY EMBODIMENTS

Figure 1:
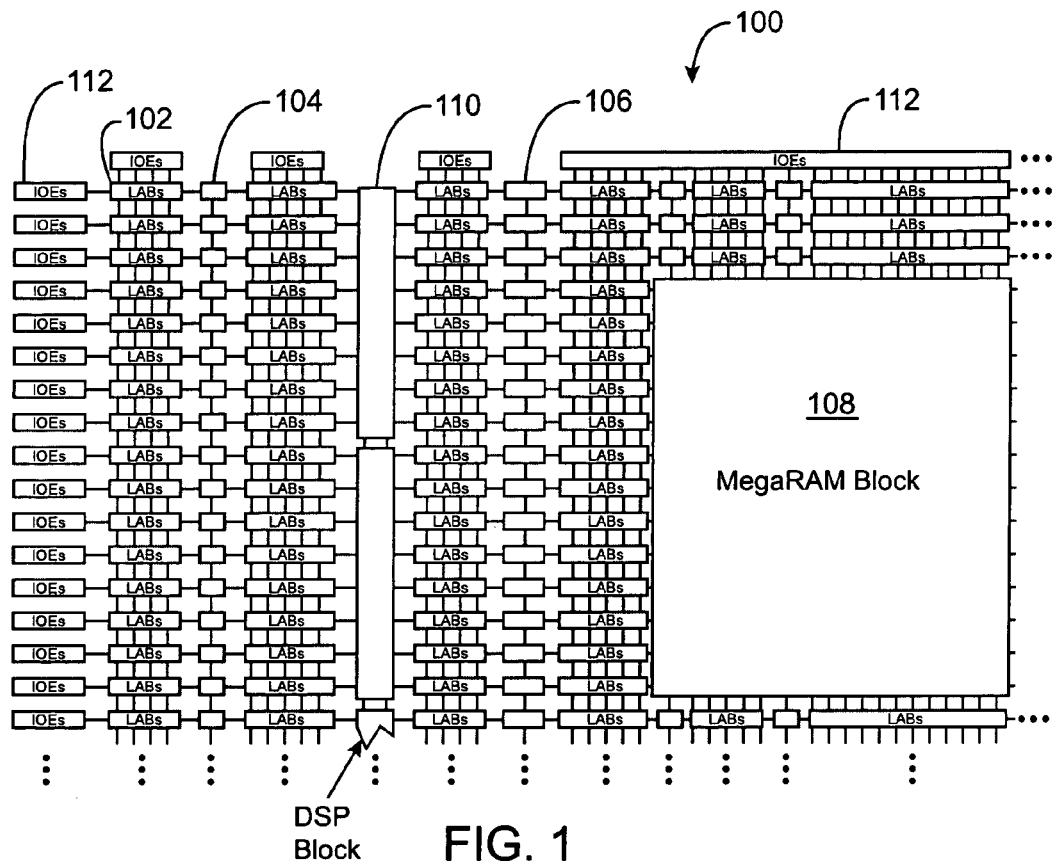
FIG. 1 is a simplified block diagram of a programmable logic device that is improved by incorporating embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106, and an M-Block 108 providing 512K bits of RAM. These memory blocks may also include shift registers and FIFO buffers. PLD 100 further includes digital signal processing (DSP) blocks 110 that can implement, for example, multipliers with add or subtract features.

It is to be understood that PLD 100 is described herein for illustrative purposes only and that the present invention can be implemented in many different types of PLDs, FPGAs, and the other types of digital integrated circuits.

Figure 2:
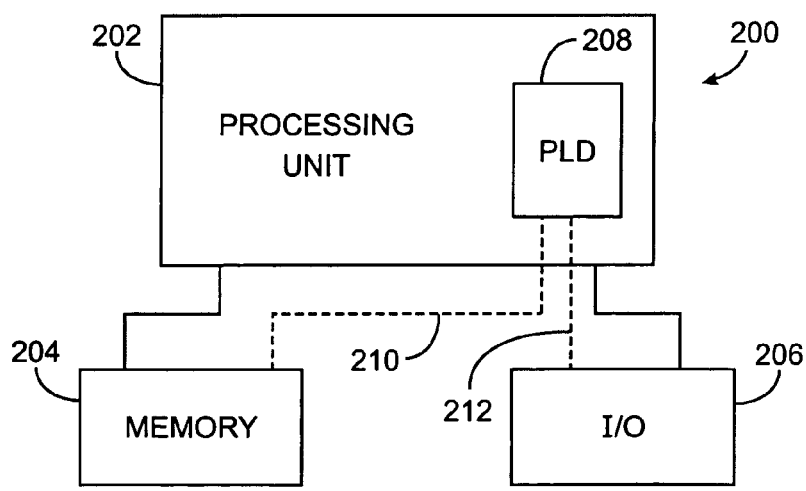
FIG. 2 is a block diagram of an electronic system that is improved by incorporating embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
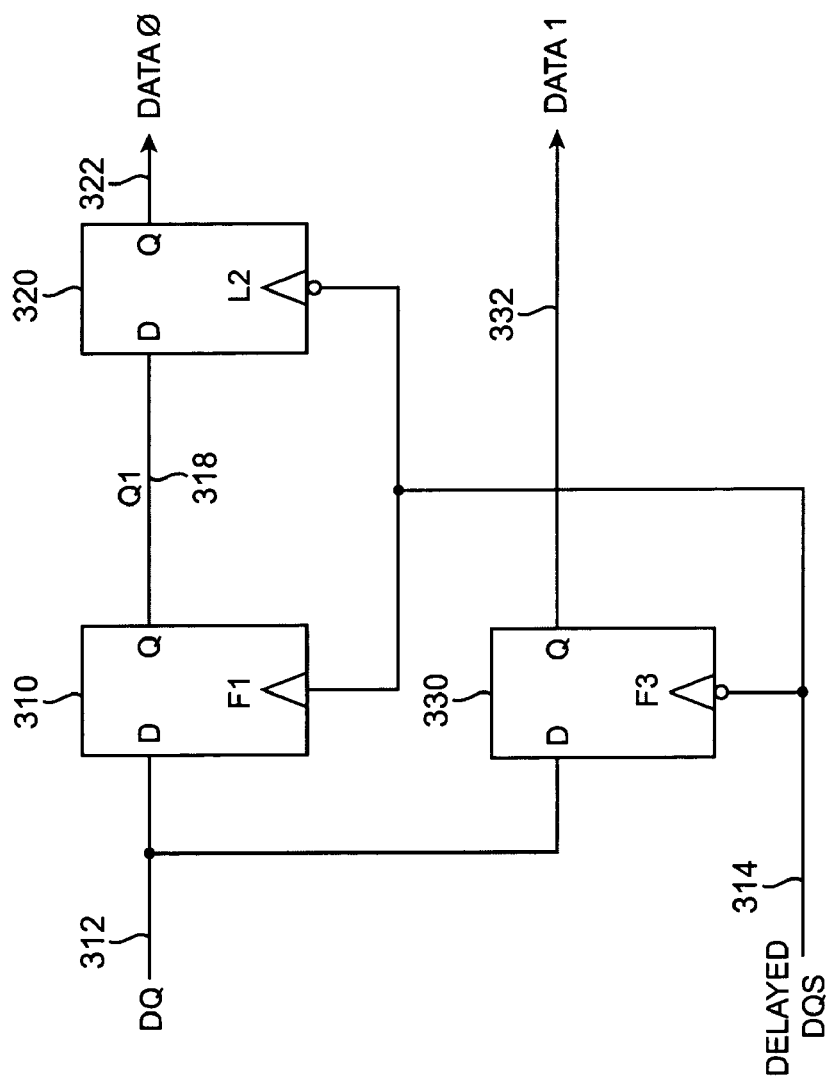
FIG. 3 is a block diagram of a double-data rate input cell that is improved by incorporating an embodiment of the present invention.

FIG. 3 is a block diagram of a double-data rate input cell that is improved by incorporating an embodiment of the present invention. This block diagram includes a first flip-flop 310, a latch 320, and a second flip-flop 330. Data signal DQS is received on line 312 by the first flip-flop 310 and the second flip-flop 330. A clock signal DQS is received, and delayed or phase-shifted, typically by approximately 90 degrees, and provided on line 314 as a delayed DQS signal by a phase-shift circuit (not shown for simplicity). The delayed DQS signal on line 314 is received a clock input of the first flip-flop 310 and an inverted clock input of the second flip-flop 330.

The DQ data on line 312 is stored on rising edges of the delayed DQS signal on line 314 by the first flip-flop 310 and on falling edges by the second flip-flop 330.

A latch 320 is also included. The latch 320 retimes data provided on the rising edges of the DQS signal on line 314 to falling edges of the DQS signal on line 314. The latch 320 and second flip-flop 330 each provide data on the falling edges of the delayed DQS signal on line 314. Specifically, the latch 320 provides data DATA0 on line 322 at the falling edges of the delayed DQS signal on line 314, while the second flip-flop 330 provides data DATA1 on line 332 at the following edges of the delayed DQS signal on line 314.

Figure 4:
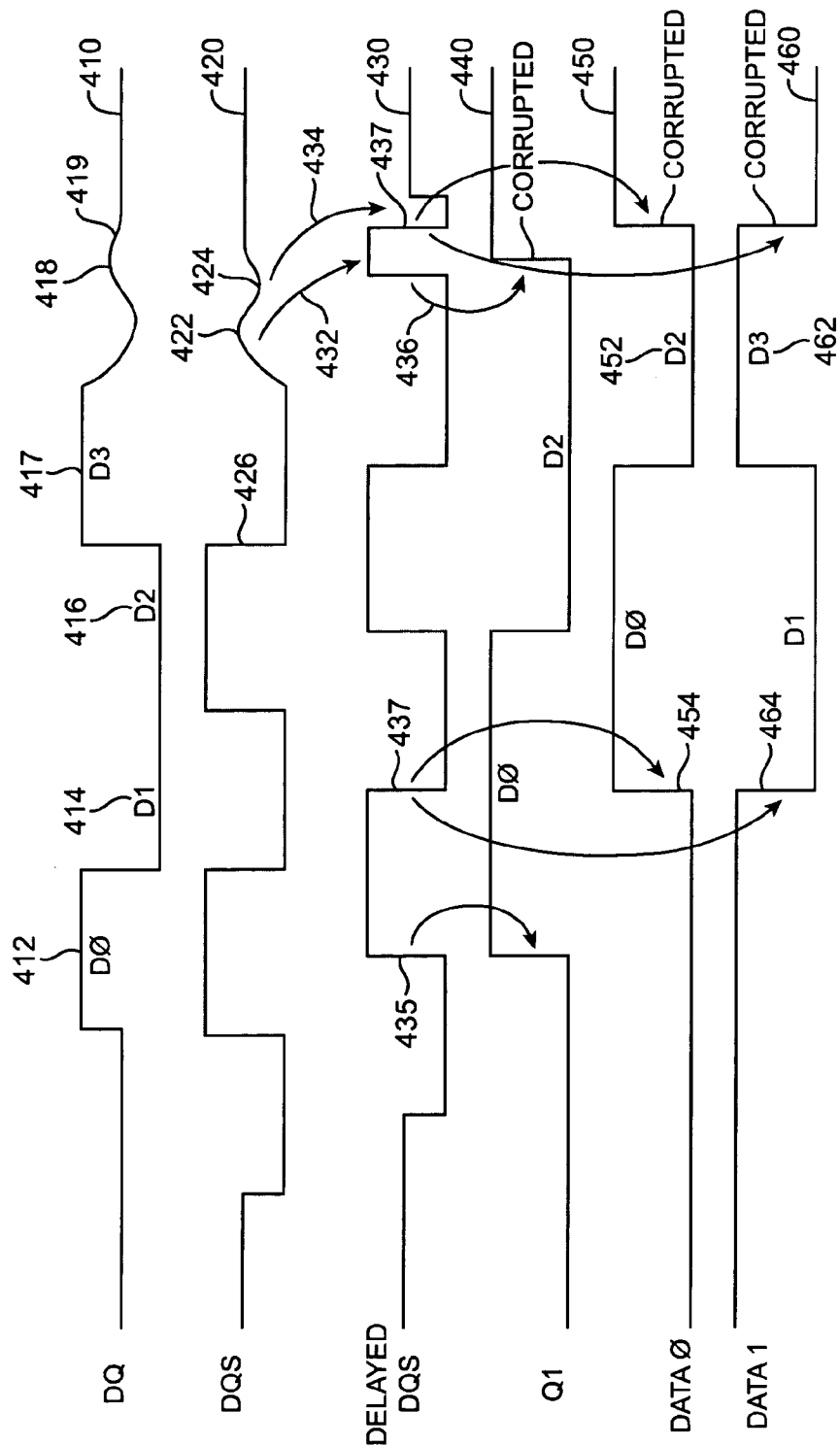
FIG. 4 is a timing diagram illustrating data corruption that can occur using the input cell of FIG. 3.

FIG. 4 is a timing diagram illustrating data corruption that can occur at the input cell of FIG. 3. This timing diagram includes signals DQ 410, clock or strobe signal DQS 420, a delayed DQS signal 430, DATA0 signal 440, Q1 440, DATA0 450, and DATA1 460.

The data signal DQ 410 and data strobe signal DQS 420 are received at the input pins of an integrated circuit high-speed data interface. The clock signal DQS 420 is delayed approximately 90 degrees thus generating the delayed DQS signal 430.

Again, the data signal DQ 410 is latched by flip-flops or other storage circuit on alternating edges of the delayed DQS signal 430. Specifically, Q1 440 is the output of a flip-flop that stores the signal DQ 410 on the rising edges of the delayed DQS signal 430. As one example, the rising edge 435 of the delayed DQS signal 430 latches data bit D0 412 of the DQ signal 410.

Similarly, the falling edges of the delayed DQS signal 430 latch the data DQ 410. As an example, the falling edge 437 of the delayed DQS signal 430 latches data bit D1 414 of the DQ signal 410.

The signals DQ 410 and DQS 420 are tri-stated following the last valid data bit D3 417. In this example, both signals are shown to be ringing and experiencing voltage transients as they enter the tri-state condition. Specifically, the signal DQ 410 has voltage transients 418 and 419, while the clock signal DQS 420 experiences voltage transients 422 and 424. The voltage transients 422 and 424 of the clock signal 420 are gained up or amplified and become the delayed DQS pulses 432 and 434. These pulses clock whatever data happens to be on the data signal DQ 410 at the time they occur. The state of the DQ signal 410 is uncertain at this time, because DQ 410 is itself entering the tristate condition and experiences ringing 418 and 419. These rising and falling edges thus clock new but incorrect or corrupted data into the input cell registers or flip-flops. In this example, rising edge 436 clocks in data corrupting the output of Q1 440. Similarly, falling edge 437 clocks invalid data thus corrupting signals DATA0 450 and DATA1 460.

The spurious clock transitions 436 and 437 clocks the data on DQ 410 as the data signal enters the tri-state region, thus possibly corrupting data at the data output lines DATA0 and DATA1. Whether data is actually corrupted will depend on the nature of the transient voltages and the previous state of the data outputs. Accordingly, embodiments of the present invention filter these clock edges such that the date in not corrupted as the DQS signal 420 enters the tri-state region.

Figure 5:
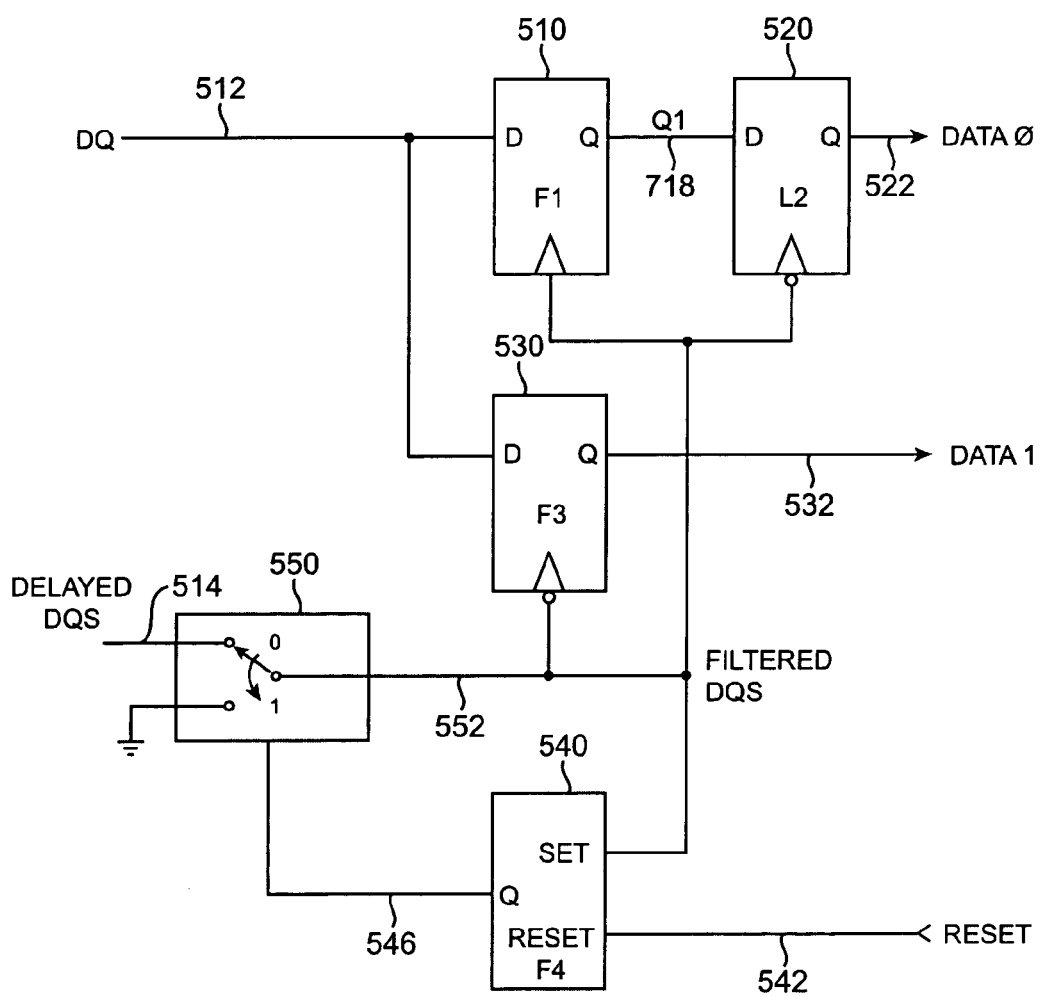
FIG. 5 is a schematic of an input cell according to an embodiment of the present invention.

FIG. 5 is a schematic of an input cell according to an embodiment of the present invention. This schematic includes a first flip-flop 510, latch 520, second flip-flop 530, third flip-flop 540, and switch 550. In various embodiments, the latch 520 may be a latch, a flip-flop, or other storage or memory circuit. This figure, as with the other included figures, is shown for illustrative purposes, and does not limit either the possible embodiments of the present invention or the claims.

A clock or strobe signal DQS is received at a data interface pin and delayed, typically by a phase-shift of 90 degrees, resulting in the delayed DQS signal on line 514. Alternately, the data DQ on line 512 can be delayed by 90 degrees compared to the clock signal DQS on line 514. The delayed DQS signal on line 514 is received by the switch for 50. The switch 550 either passes the delayed DQS signal on line 514 or ground as the filtered DQS signal on line 552.

When the delayed DQS signal on line 514 is passed as the filtered DQS signal on line 552, its rising edges clock the data DQ on line 512 into the first flip-flop 510, while its falling edges clock the data DQ on line 512 into the second flip-flop 530, which provides an output DATA1 on line 532. The falling edges of the filtered DQS single on line 552 also latch the Q1 output of the first flip-flop 510 and provide it as DATA0 on line 522. When ground is passes as the filtered DQS signal on line 552 data transitions at the outputs of the flip-flops 510 and 530 and latch 520 cease.

When valid data is received, the reset signal on line 542 resets the flip-flop 540 such that the Q output on line 546 instructs the switch 550 to pass the delayed DQS signal on line 514 as the filtered DQS signal on line 552. When the last valid data bit in a data burst on line 512 is received, the reset signal on line 542 is removed. At this point, the next active edge of the delayed DQS signal 514 sets the flip-flop 540, such that the flip-flop output Q on line 546 closes the clock path by coupling ground to the filtered DQS line 552.

It will be appreciated by one skilled in the art that other variations on this may be made consistent with embodiments of the present invention. For example, while this arrangement is particularly advantageous to a high-speed double-data rate interface circuit, other types of interface circuits would benefit by incorporation of embodiments of the present invention. For example, an interface where the DQS signal is not delayed would benefit. Further, an interface where the data signal is delayed by 90 degrees instead of the clock signal would benefit by incorporation of embodiments of the present invention.

Figure 6:
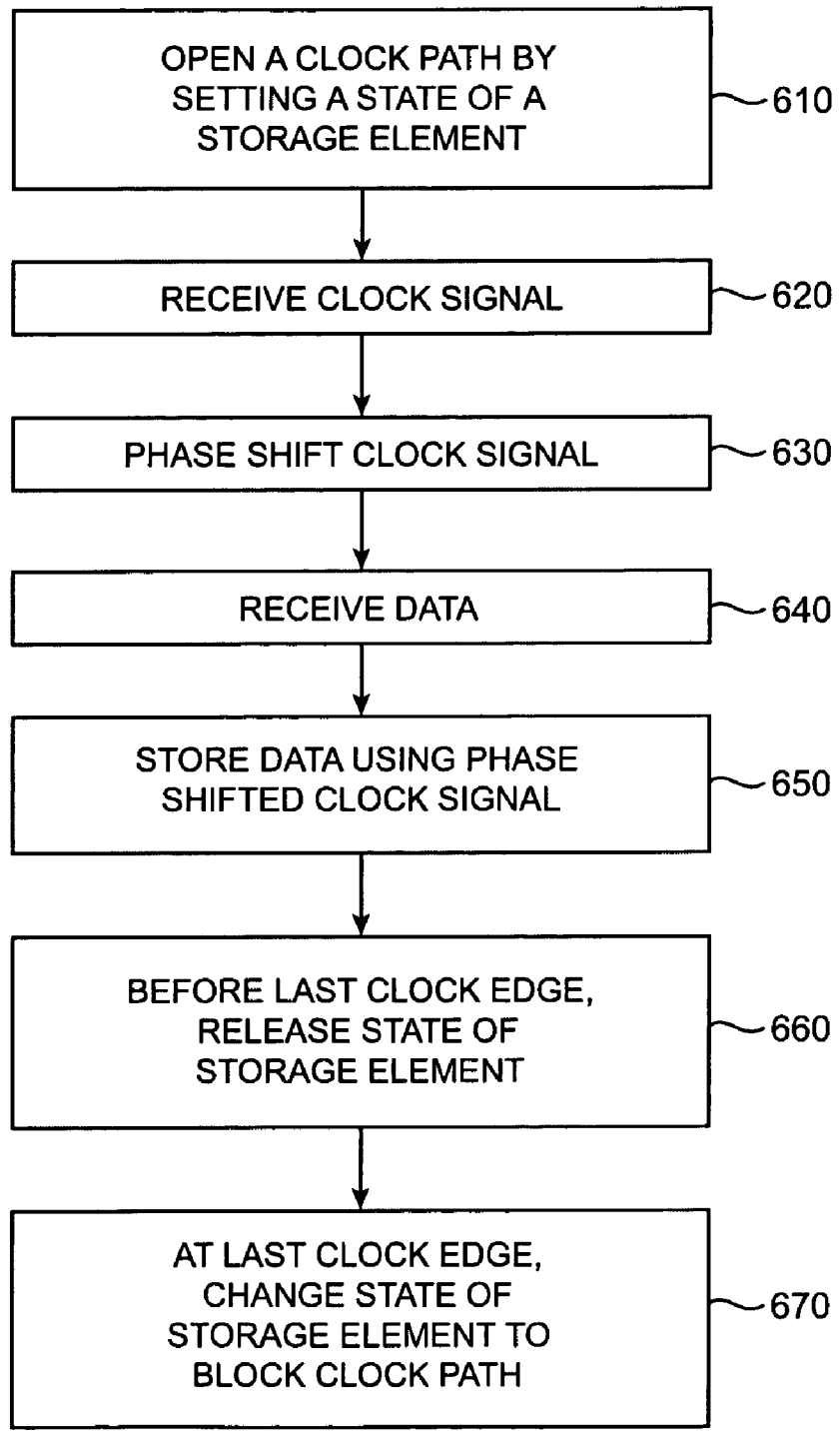
FIG. 6 is a flowchart illustrating the operation of an input cell according to an embodiment of the present invention.

FIG. 6 is a flowchart illustrating the operation of an input cell according to an embodiment of the present invention. In act 610, a clock path is opened by setting a state of a storage element. A clock signal is received in act 620. The clock is phase-shifted in act 630. Alternately, in some embodiments, the clock is not phase-shifted, but rather used as is. In act 640, data is received. In other embodiments of the present invention, the data is phase-shifted relative to the clock signal.

In act 650, data is stored using the phase-shifted clock signal. Before the last clock edge, or when the last data bit in a burst is received, the state of the storage element is released in act 660. In act 670, the last clock edge changes the state of the storage element such that the clock path is blocked and is no longer used as a timing signal to store data until it is opened again in act 610.

Figure 7:
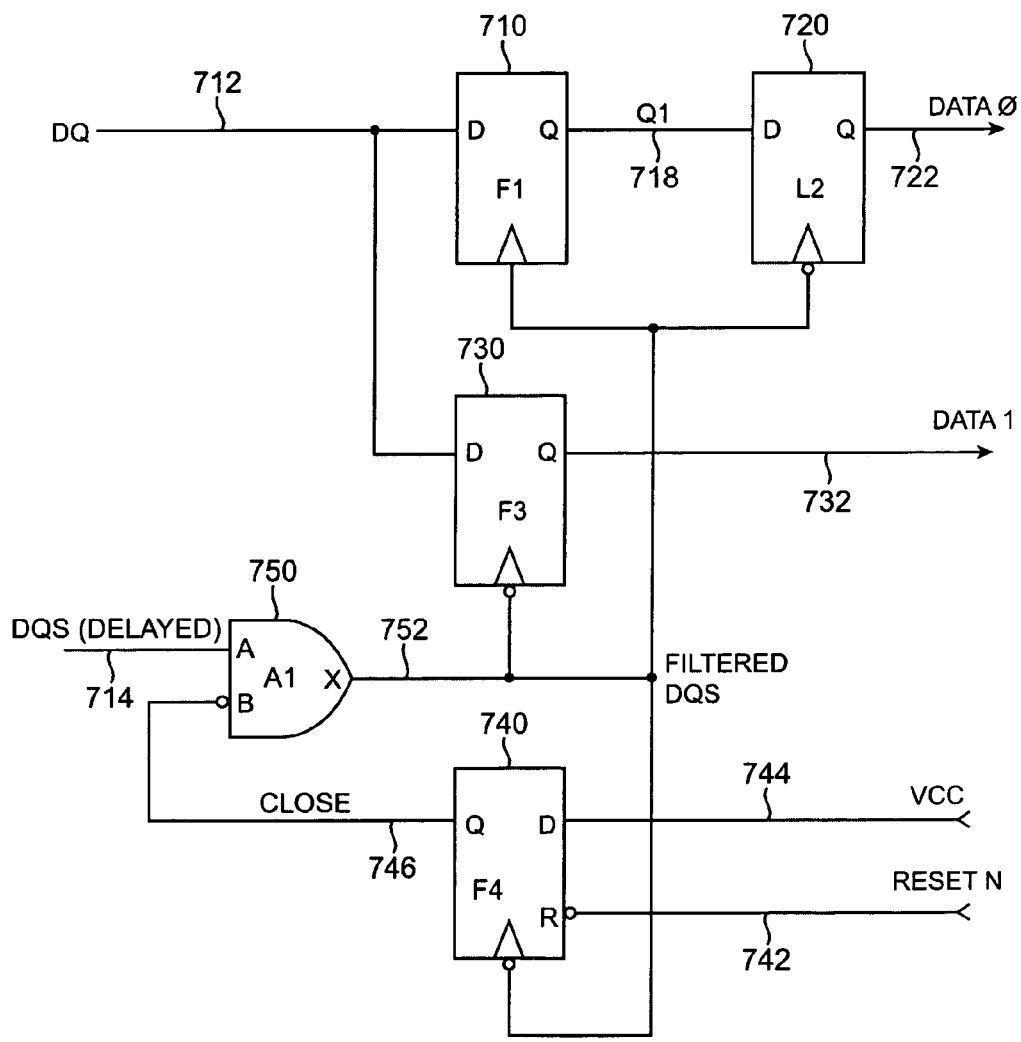
FIG. 7 is another schematic of an input cell according to an embodiment of the present invention.

FIG. 7 is another schematic of an input cell according to an embodiment of the present invention. This figure includes a first registers 710, latch 720, second registers 730, a third register 740, and an AND gate 750. Depending on the state of the CLOSE signal on line 746, the delayed DQS signal on line 714 is either blocked or passed by the AND gate 750 as the filtered DQS signal on line 752.

When the RESET signal on line 742 is low, the CLOSE signal on line 746 is forced low, and the and gate 750 passes the delayed DQS signal on line 714 as the filtered DQS signal on line 752. When the RESET signal on line 742 is high, the next falling edge of the filtered DQS signal on line 752 clocks the VCC signal (or other logic high signal) on line 744, thus changing the state of the CLOSE signal on line 746 to a logic high. The high level of the CLOSE signal on line 746 forces the signal level of the filtered DQS signal on line 752 to a logic low, thus disabling or blocking the delayed DQS signal on line 714.

As before, the first flip-flop 710 stores data on the DQ line 712 on rising edges of the filtered DQS signal on line 752. The second flip-flop 730 latches the data signal DQ on line 712 on the falling edges of the filtered DQS signal on line 752. The output of the first flip-flop, Q1 on line 718, is retimed to the falling edges of the filtered DQS signal on line 752 by latch 720. The latch 720 provides an output DATA0 on line 722, while the second flip-flop 730 provides a data output DATA1 on line 732.

It will be appreciated by one skilled in the art that other variations on this are possible. For example, the AND gate 750 may be placed in front of the phase-shift circuitry (not shown) in the DQS path. Also, the latch circuit shown as latch 720 can be replaced by a flip-flop or other storage or memory circuit.

Figure 8:
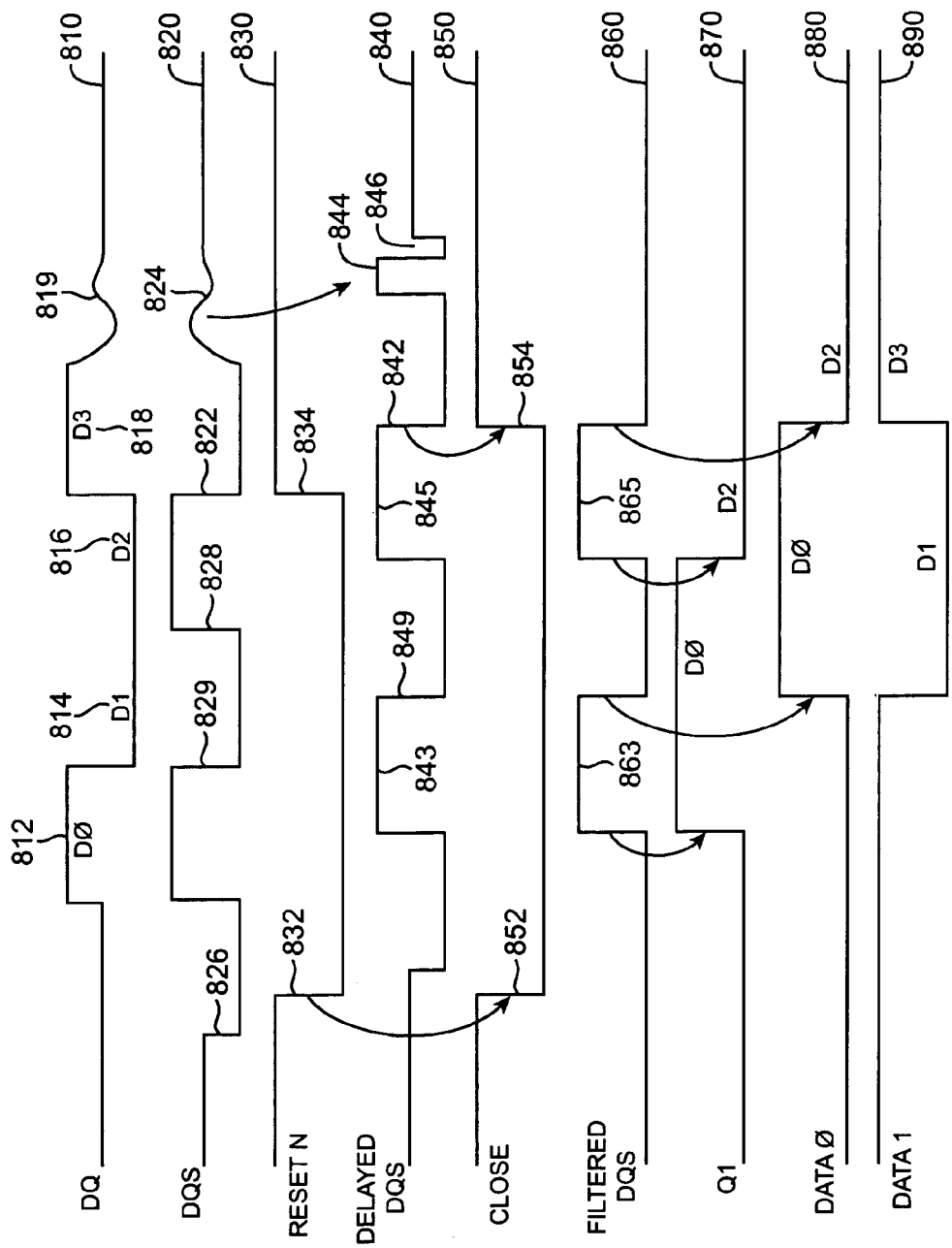
FIG. 8 is a timing diagram of the input cells shown in FIGS. 5 and 7.

FIG. 8 is a timing diagram of signals associated with the input cells shown in FIGS. 5 and 7. This figure includes a data signal DQ 810, a clock or strobe signal DQS 820, RESET signal 830, a delayed DQS signal 840, a signal to control the connecting and disconnecting of the clock signal from the input cell, CLOSE 850, filtered DQS signal 860, Q1 870, and the data output signals DATA0 880, and DATA1 890.

The data signal DQ 810 and the strobe signal DQS 820 are the same in this example as those shown in the example of FIG. 4. The signals may be received and a data interface circuits on an integrated circuit. For example, these signals may be received at a high-speed data interface circuit. The data interface circuit may be a double-data rate, other multiple data rate, or conventional data interface, though a double-data rate interface is shown in this example.

The DQ signal becomes active and transmits a burst of the data, which in this example is four data bits in length, specifically D0 812, D1 814, D2 816, and D3 818 are received as a burst. Typically, a burst of data consists of many more data bits than the four that are illustrated here for simplicity. After the data burst has concluded, both input signals DQ 810 and DQS 820 return to a tri-state condition. The ringing and transients associated with this transition are exaggerated as 819 for the DQ signal 810 and 824 for the DQS signal 820. In practical circuits, there will be ringing and transients associated with each of the edges of the DQ 810 and DQS 820 signals, though only those associated with the beginning of the tri-state condition are shown for simplicity.

A RESET signal 830 is received. This RESET signal may be generated by logic associated with the data interface. A falling edge 832 of the RESET signal 830 opens the clock path. This falling edge and may be timed or generated by the occurrence of another event, such as the initial falling age 826 of the DQS signal 820, which occurs as the DQS signal exits the tri-state condition.

The RESET signal 830 also has a rising edge 834 that may be generated by a similar event. For example, the receipt of the last valid data bit in a data packet or burst, D3 818 may be used to trigger the rising edge 834 of the reset signal 830. Alternately, other signals, such as the last valid rising edge 828 of the DQS signal 820 may trigger the rising edge 834 of the RESET signal 830. No matter the event, the circuit operates properly so long as the rising edge 834 of the RESET signal 830 occurs following the penultimate falling edge 849 and before the last falling edge 842 of the delayed DQS signal 840.

The DQS signal 820 is phase shifted and amplified as the delayed DQS signal 840. The delayed DQS signal 840 includes spurious pulses 844 and 846 caused by glitches in the DQS signal as it enters the tri-state condition.

The CLOSE signal 850 has a falling edge 852 that is generated by the falling edge 832 of the RESET signal 830. The CLOSE signal stays low, that is in the open condition, until the end of the data burst. Specifically, once the RESET signal 830 returns high, the following falling edge of the delayed DQS signal 842 triggers the rising edge 854 of the CLOSE signal 850.

The CLOSE signal 850 filters the delayed DQS signal 840 in order to generate the filtered DQS signal 860. Specifically, the spurious pulses 844 and 846 occur when the close signal 850 is high, thus they do not appear as part of the filtered DQS 860 signal. However, delayed DQS signal pulses 843 and 845 occur while the close signal 850 is low or in the open state, thus they are passed as pulses 863 and 865 of the filtered DQS signal 860.

The edges associated with pulses 863 and 865 are received at the clock inputs of flip-flops or other storage elements that receive the DQ signal 810. Specifically, rising edges of pulses 863 and 865 clock data bits D0 812 and D2 816 of the DQ signal 810, resulting in signal Q1 870. Signal Q1 870 is retimed to the falling edges of the filtered DQS signal 860, resulting in DATA0 880. The falling edges of the filtered DQS signal 860 clock data bits D1 814 and D3 818 and provide them as signal D1 890.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
 a first storage element configured to store a data signal when a clock signal transitions from a first logic level to a second logic level;
 a first logic gate configured to pass the clock signal to the first storage element when a first control signal is asserted and to not pass the clock signal to the first storage element when the first signal is not asserted; and
 a second storage element configured to assert the first control signal when a second control signal is asserted, and further configured to de-assert the first control signal after the second control signal is de-asserted and the clock signal transitions from the first logic level to the second logic level.

2. The integrated circuit of claim 1 further comprising:
 a third storage element configured to store the data signal when the clock signal transitions from the second logic level to the first logic level.

3. The integrated circuit of claim 2 further comprising a fourth storage element configured to store an output from the third storage element when the clock signal transitions from the first logic level to the second logic level.

4. The integrated circuit of claim 1 wherein the first storage element and the third storage element are flip-flops.

5. The integrated circuit of claim 1 wherein the first logic gate is a combinatorial logic gate.

6. The integrated circuit of claim 1 wherein the integrated circuit is a field programmable gate array.

7. A method of digitally filtering a clock signal received by an interface circuit comprising:
 asserting a first control signal;
 after the first control signal is asserted, connecting a clock input port to an input cell;
 receiving a valid clock signal at the clock input port, the clock signal transitioning between a first logic level and a second logic level;
 de-asserting the first control signal;
 after de-asserting the first control signal, receiving a next clock transition; and
 disconnecting the clock input port from the input cell.

8. The method of claim 7 wherein the input cell comprises a double-data rate input cell.

9. The method of claim 7 wherein the input cell comprises a first storage element configured to store a data signal on rising clock signal transitions and a second storage element configured to store the data signal on falling clock signal transitions.

10. The method of claim 9 wherein the first and second storage elements are flip-flops.

11. The method of claim 7 wherein the clock signal is connected and disconnected by a combinatorial logic gate under control of a third storage element.

12. The method of claim 11 wherein the first, second, and third storage elements and combinatorial logic gate are formed on a field programmable integrated circuit.

13. An integrated circuit comprising:
 a first pad;
 a first storage element having an input coupled to the first pad;
 a second storage element having an input coupled to the first pad;
 a logic gate coupled to a clock input of the first storage element and a clock input of the second storage element; and
 a third storage element having an output coupled to the first logic gate,
 wherein the logic gate is configured to receive a clock signal and provide the clock signal to the first storage element and the second storage element when the output of the third storage element is in a first state and to not provide the clock signal to the first storage element and the second storage element when the output of the third storage element is in a second state.

14. The integrated circuit of claim 13 wherein the third storage element is configured to receive a first control signal and an output of the first logic gate.

15. The integrated circuit of claim 14 wherein the third storage element is configured to be in the first state when the first control signal is asserted.

16. The integrated circuit of claim 15 wherein the third storage element is configured to be in the second state following a clock transition from a first logic level to a second logic level after the first control signal is de-asserted.

17. The integrated circuit of claim 16 wherein the first storage element stores data on the pin when the clock transitions from the first logic level to the second logic level and the second storage element stores data on the pin when the clock transitions from the second logic level to the first logic level.

18. The integrated circuit of claim 17 wherein the first, second, and third storage elements are flip-flops.

19. The integrated circuit of claim 18 wherein the logic gate is a combinatorial logic gate.

20. The integrated circuit of claim 13 wherein the integrated circuit is a field programmable gate array.

* * * * *